United States Patent [19]

Nicolas et al.

[11] 4,337,573

[45] Jul. 6, 1982

[54] METHOD FOR CONSTRUCTING AN ELECTRICAL INTERCONNECTION CIRCUIT AND APPARATUS FOR REALIZING THE METHOD

[75] Inventors: Gérard Nicolas, Voreppe; Gérard Ponthenier, Le Pont de Claix; Gérard Turc, Echirolles, all of France

[73] Assignee: Commissariat a l'Energie Atomique, Paris, France

[21] Appl. No.: 154,144

[22] Filed: May 29, 1980

[30] Foreign Application Priority Data

Jun. 7, 1979 [FR] France ............................... 79 14592

[51] Int. Cl.³ .......................... H05K 3/20; B23P 19/00
[52] U.S. Cl. ..................................... 29/831; 29/748; 228/33; 228/179
[58] Field of Search ................ 29/831, 860, 857, 859, 29/850, 745, 747, 748; 174/68.5; 228/179; 361/406, 403; 219/56; 339/17 R, 219 R

[56] References Cited

U.S. PATENT DOCUMENTS 3,500,290 3/1970 Hall et al. ....................... 339/17 LC
3,643,321 2/1972 Field et al. .......................... 228/179
3,675,840 7/1972 Towell ............................ 228/904 X
3,812,581 5/1974 Larson et al. ........................ 29/854
3,842,190 10/1974 Towell ............................... 174/68.5
3,960,309 6/1976 Hazel ............................... 219/56 X
3,981,076 9/1976 Nicolas ............................ 29/850 X
4,031,612 6/1977 Nicolas .................................. 29/850

FOREIGN PATENT DOCUMENTS

605703 5/1978 U.S.S.R. ............................... 228/36

Primary Examiner—Francis S. Husar
Assistant Examiner—Carl J. Arbes
Attorney, Agent, or Firm—Pearne, Gordon, Sessions, McCoy & Granger

[57] ABSTRACT

Method and apparatus for producing an electrical interconnection circuit for electronic components in which an insulating base support incorporating conductive zones is used, the different conductive zones to be interconnected are joined by an insulating wire by adhering it to the base support, the bared wire is welded to the conductive zones and is cut after welding, wherein a thermally weldable insulating wire is used and liquid flux is deposited on the parts of the wire to be welded resting on the conductive zones before making the weld.

10 Claims, 13 Drawing Figures

METHOD FOR CONSTRUCTING AN ELECTRICAL INTERCONNECTION CIRCUIT AND APPARATUS FOR REALIZING THE METHOD

BACKGROUND OF THE INVENTION

The invention relates to a method for constructing an electrical interconnection circuit for electronic components and to an apparatus for realising the method.

Miniaturised electronic components are generally fixed to an insulating base support on which are provided the various electrical interconnections between these components. In order to benefit to the maximum from the increasing miniaturisation of electronic components it is necessary to place a maximum number thereof on a minimum size base support surface. This result can only be obtained by miniaturising the electrical connections and by using insulated wires, whose installation can be carried out automatically and whose arrangement can be modified as required.

A certain number of methods and apparatuses are known making it possible to automatically produce in accordance with programmable arrangements the electrical interconnection circuits between different electronic components. However, these known apparatuses are generally complex in cases where they make it possible to obtain a suitable miniaturisation of the interconnection circuits. Simpler apparatuses do not make it possible to obtain a satisfactory component density, bearing in mind the miniaturisation thereof.

An apparatus is already known (see U.S. Pat. No. 4,031,612) in which an insulating base support is used incorporating conductive zones. The zones to be interconnected are linked by an insulating wire by adhering it to the base support and the bared wire is welded to the conductive zones and is cut after welding. This method has the advantage of the subsequent deposition of the interconnection wires making it possible to modify the interconnection circuit as required, on the basis of previously prepared standardised cards.

Moreover, another apparatus is known in which the electrical interconnection circuit is provided by means of a thermally weldable insulated wire which enables both a limitation in the dimensions of the interconnections permitting their crossings due to the insulation of the wire, whilst also making it possible to use an ancillary device for baring the wire, because the latter is bared and welded simultaneously by means of a welding iron. However, due to the double function of the iron and the linear contact between the latter and the wire to be welded, heating must last for a relatively long time in order to bring about the complete sublimation of the polyurethane varnish which normally forms the insulation surrounding the wire and the melting of the tin-lead layer deposited on the conductive pellet in order to bring about the weld. Thus, welding must be carried out on a relatively large conductive part (diameter approximately 2 mm) to ensure that the heating period has no prejudicial effects, such as separation and damage to the pellet. Thus, the overall dimensions of the interconnection circuit obtained with such an apparatus are not reduced sufficiently to permit an optimum utilisation of the presently available miniaturised electronic components. The apparatus is not therefore suitable for the automatic production of the electrical interconnection circuits between these components.

BRIEF SUMMARY OF THE INVENTION

In order to obviate the disadvantages of the known apparatus and in accordance with a first feature of the invention, a method for producing an electrical circuit on an insulating support base incorporating conductive zones able to receive the electronic components is proposed and which is characterized in that the interconnection zones are connected by a thermally weldable insulated wire and liquid flux is deposited on the parts of the wire to be welded and resting on the conductive zones before making the weld.

Due to the use of a thermally weldable wire the invention makes it possible to obviate a separate tinning operation with respect to the insulated wire.

Furthermore, due to the addition of flux prior to welding, the invention makes it possible to significantly decrease the heating time, the heat induced by the iron being transferred very rapidly to the entire outer surface of the wire and to the adjacent surface of the conductive pellet. Thus, within the same operation, it is possible to bare the wire and accelerate the melting of the tin-lead layer deposited on the conductive pellet in order to make the weld, whilst limiting the oxidation of the bared wire and the tin. The dimensions of the conductive pellet can be substantially reduced compared with those of pellets used in prior art apparatus using a thermally weldable insulating wire.

According to a second feature of the invention a method for producing an electrical interconnection circuit of an insulating base support incorporating conductive zones able to receive electronic components is proposed in which the wire is cut after welding and the unwelded end of the cut wire is gripped and brought to another conductive zone in order to start another interconnection. This permits a precise positioning and holding in place of the wire with respect to the conductive pellet to which it has to be welded.

According to a third feature of the invention a method for providing an electrical interconnection circuit of an insulating base support incorporating conductive zones which can receive the electronic components is proposed in which the base support incorporates groups of aligned conductive zones able to receive electronic bases having two series of aligned clips, wherein the conductive zones incorporate pellets, each of which defines a connector able to receive one clip of the case and a zone for the welding of the juxtaposed wires to the connector in the direction defined by the corresponding group of conductive zones. Each pellet can be cut in such a way as to have a reduced width zone acting as a thermal shunt between the connector and the welding zone, which prevents the outflow of tin-lead into the hole for receiving the clip on the case, the latter not yet being mounted during welding, whilst maintaining the welded wire in place in the case of re-melting of the tin. Each pellet can also be contained in a square, whose side is substantially equal to 3/5ths of the distance separating the centre of two successive conductive zones of one and the same group, whereby the connector and the welding zone occupy the square, two juxtaposed rectangles, whose respective surfaces are substantially equal to $\frac{2}{3}$ and $\frac{1}{3}$ of the total surface of the square. These different characteristics make it possible to provide welding pellets with such substantially reduced dimensions, whose use would not be possible if the liquid flux was not deposited on the thermally weldable insulated wire before making the weld. The shape and arrangement of the said pellets thus assisting in the miniaturisation of the interconnection circuit in the method according to the invention.

The invention also relates to an improvement to an apparatus for realising an electrical interconnection circuit for electronic components having the function of connecting by means of insulated wires conductive zones positioned on a base support which is optionally covered by an adhesion resin outside the said conductive zones, wherein said apparatus comprises a table XY to which is fixed the insulating base support, means for controlling the translations of said table XY in two perpendicular directions, a head constituted by a fixed shaft and a rotary frame connected to the shaft, means for controlling the rotation of the frame about an axis perpendicular to the support, means fixed to the fixed shaft for uncoiling the insulated wire and means fixed to the rotary shaft for applying the wire to the support, whereby the wire is welded to the conductive zones and cut after welding, this improvement being characterized in that the tool-holding head also carries means for depositing a predetermined quantity of flux to be welded on the wire to be welded and resting on a conductive zone and means for simultaneously bearing and welding the wire of said conductive zone.

According to a preferred embodiment of the invention, the means for depositing a given quantity of flux to be welded incorporate a movable arm having a curved end and a flux reservoir with a constant level in which the curved end of the arm is in permanent contact with the flux in the inoperative state.

According to another feature of the invention, the apparatus defined hereinbefore also comprises means for gripping the unwelded end of the cut wire. Preferably, these means incorporate a clamp and the means for cutting the wire incorporate a knife, the clamp being carried by the knife and is provided with a curved end which moves in a direction perpendicular to the base support with respect to the knife, the displacement of the curved end of the clamp relative to the knife controlling the opening and closing of the clamp. According to embodiment of the invention, the curved end of the clamp projects beyond the cutting blade of the knife when the clamp is open in such a way that the operation of the knife brings about the abutment of the curved end of the clamp with the base support and then the displacement of the knife relative to the end of the clamp in the direction corresponding to the closure of the latter. In this same embodiment of the invention, the means for baring and welding the wire comprise an abutment which is able to come level with a facing abutment formed on the clamp during the construction thereof in such a way that the displacement of the knife away from the base support leads to the abutment of the clamp with the abutment formed on the means for baring and welding the wire, followed by the displacement of the knife with respect to the end of the clamp in the direction corresponding to the opening of the latter. Thus, the end of the clamp can have two facing jaws which are elastically operated moving one away from the other and defining on their opposite edges cam surfaces with which cooperate fingers rigidly fixed to the knife. The shape of the cam surfaces is such that the clamp is open when its end projects beyond the cutting blade of the knife and closed when its end is substantially aligned with the cutting blade of the knife. Preferably, the clamp is then formed from a preshaped elastic wire, such as a piano cord, bent over in a U-shaped manner to define the jaws of the clamps by its two lozenge-shaped ends, the elastic wire being fixed to the knife by its median portion. The fingers fixed to the knife cooperate with jaws in the vicinity of the acute angle of the lozenge opposite to the end of the clamp, when the latter projects beyond the cutting blade of the knife and cooperate with the jaws in the vicinity of the obtuse angles of the lozenge and the side of the end of the clamp when the latter is substantially aligned with the cutting blade of the knife.

BRIEF DESCRIPTION OF THE DRAWINGS

The invention is described hereinafter relative to non-limitative embodiments and with reference to the attached drawings, wherein show.

DETAILED DESCRIPTION OF THE PREFERRED EMBODIMENTS

Figures 1, 2:
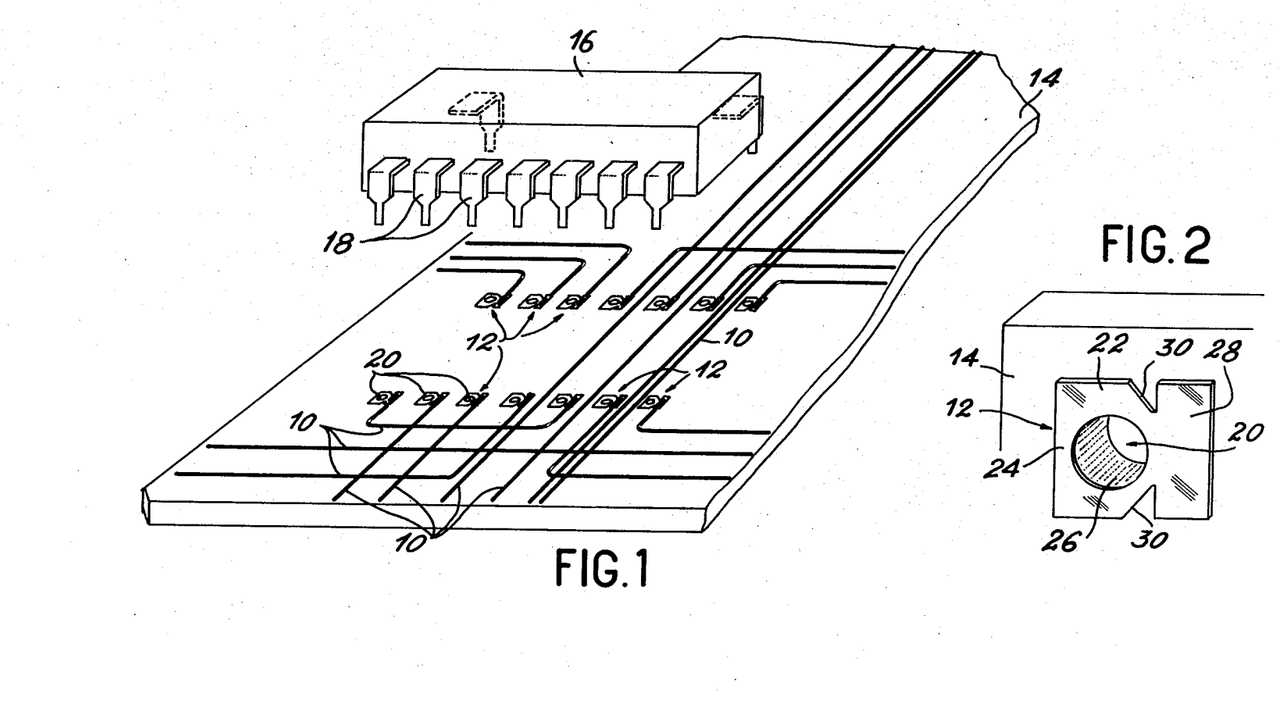
FIG. 1 a perspective view representing a fraction of an insulating base support incorporating groups of aligned conductive pellets interconnected by an electric circuit according to the method of the invention, said pellets being able to receive the aligned clips of a component such as an electronic case.
FIG. 2 a larger-scale view showing one of the conductive pellets and its fixing to the insulating base support shown in FIG. 1.

As illustrated in FIG. 1, the invention aims at permitting the construction of a circuit incorporating a certain number of electrical interconnections by means of wires 10 electrically connecting the conductive zones 12 fixed to one of the faces of insulating base support 14. This circuit is able to receive a certain number of miniaturised electronic components, such as case 16. More specifically, the electronic component 16 for mounting on support 14 incorporates clips 18 received in holes 20 traversing support 14 and conductive zones 12, so as to permit the fixing of said components, e.g. by welding and their interconnection in accordance with a previously defined electrical circuit by means of conductive zones 12 and connecting wires 10. The latter are adhered to support 14 and welded to zones 12 before the fitting of components in accordance with a process which will be described hereinafter.

According to the invention, the connecting wires 10 are conductor wires, such as insulated and thermally weldable copper wires. The insulation is for example constituted by a coating of polyurethane varnish which volatilizes very rapidly, i.e. in one second at 400° C. and in three seconds at 380° C. To ensure the satisfactory mechanical behaviour of wire 10, a thermosetting adhesive coating is deposited on the surface of support 14 for receiving the wires and components. This adhesive can be deposited on all the non-conducting parts of this surface by any known means. Thus, it can be a dry film which adheres to the support by heating, the holes corresponding to the conductive zones being made before or after depositing the film on the support, for example by silk screen printing. The resin can also be deposited in solution by silk screen printing or in the form of a chemically etched continuous photosensitive film this taking place for example after irradiation of the zones to be retained through a photographic mask. The adhesion can also be hardenable by radiation. It can also be deposited locally by a machine or can be present on the wire from the outset.

In order to permit the automatic production of the interconnection circuit according to the invention the connecting wires 10 must in no case be placed on conductive zones 12 corresponding to unconnected electronic components. Moreover, these wires must necessarily be arranged either horizontally or vertically or at 45° between rows formed by conductive zones 12, as is shown in FIG. 1.

Under these conditions, and as is in particular illustrated in FIG. 2, the conductive zones 12 each incorporate a pellet 22 defining a connector 24 and a welding zone 28. The walls of hole 20 for receiving one of the clips 18 of component 16 are metallized as shown at 26. The welding zone 28 is juxtaposed with respect to connector 24 and is separated from the latter by facing triangular notches 30 which define between them a thermal shunt, whose function can be gathered from the following description. The pellet 22 is constituted by an approximately $35\mu$ thick copper coating covered by an at least $25\mu$ thick tin-lead coating making it possible to bring about the welding of wires 10 without supplying tin.

Preferably when the base support 14 has aligned groups of conductive zones 12 which can receive electronic components, such as case 16 and provided with two series of aligned clips 18, the welding zone 28 of each of these pellets 22 is juxtaposed with the connector 24 in the direction defined by the corresponding group of conductive zones 12, as illustrated in FIG. 1. Furthermore, each of the pellets 22 is contained within a square, whose side is substantially equal to 3/5ths of the distance separating the center of two successive conductive zones 12 of the same group, the connector 24 and welding zone 28 occupying in the same square two juxtaposed rectangles, whose respective surfaces are substantially equal to $\frac{2}{3}$ and $\frac{1}{3}$ of the total surface of the square, as is shown in FIG. 2. In practice, the distance separating the centre of two successive conductive zones 12 of one and the same group is standardized and is equal to 2.54 mm in such a way that pellet 22 is then inscribed in a square, whose side is equal to 1.524 mm. This makes it possible to pass up to two connecting wires 10 between two successive conductive zones 12 of the same group, as shown in FIG. 1, for a spacing between the wires of 0.508 mm. It would be possible to pass through three and even four wires when working with a smaller spacing, e.g. 0.254 mm.

The construction, arrangement and dimensions of the pellets 22 described hereinbefore make it possible to significantly improve the density of components on support 14, whereby 30 cases like case 16 can be arranged on 1 dm² of support.

The use of pellets 22 with a reduced surface area is made possible therefore by the method of producing the interconnection circuit 10 according to the invention.

Figure 3:
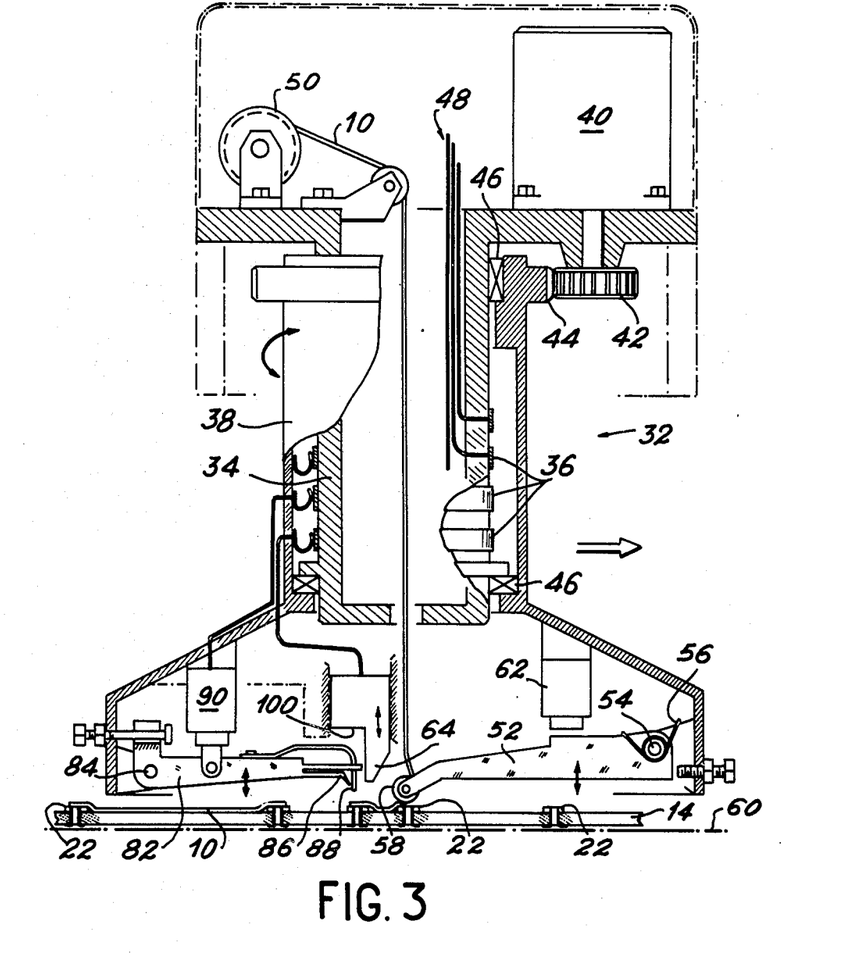
FIG. 3 a sectional view diagrammatically showing an apparatus for realising the electrical interconnection circuit shown in FIG. 1, said apparatus being in accordance with the teaching of the present invention.

This method utilizes an apparatus as diagrammatically shown in FIG. 3, which comprises a tool-carrying head designated in general manner by reference numeral 32. The head 32 essentially comprises the fixed central shaft 34 electrically connected by rotary contacts 36 to a rotary frame 38, the latter being displaced by an electric motor 40 via a pinion 42 acting on a toothed wheel 44 integral with frame 38. The rotary frame 38 is supported by central shaft 34 by means of two bearings 46. The central shaft 34 carries the not shown power supply for the different tools, whereby the voltage supplied arrives by wires 48. The shaft 34 also carries a supply system 50 with insulating wires 10.

The rotary frame 38 carries an arm 52 by means of a pivot 54 on which is mounted a torsion spring 56 which, by means of a runner 58 mounted at the free end of arm 52, forces wire 10 against support 14 the latter being mounted on a table 60. An electromagnetic 62 moves arm 52 upwards with respect to FIG. 3 in such a way as to move the runner 58 away from support 14 in opposition to the force exerted by spring 56.

Figure 4:
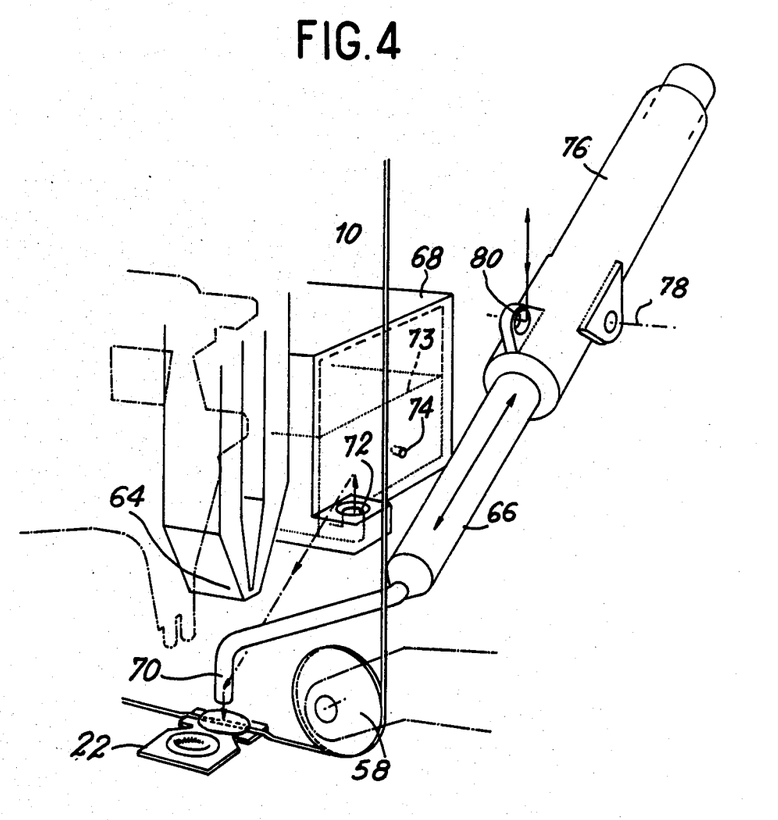
FIG. 4 a perspective view showing certain of the tools carried by the apparatus of FIG. 3 and particularly a welding iron, together with an assembly making it possible to deposit a given quantity of flux to be welded prior to using the iron.

The rotary frame 38 also carries a welding device incorporating a welding iron, whose pane 64 shown in perspective manner in FIG. 4 is controlled by an electromagnet means (not shown) which is able to move it between a raised position, shown in FIG. 4, and an operating position in which it is applied to wire 10. Pane 64 is directly heated by conduction and its thermal inertia is as low as possible, so that temperature rises and falls very rapidly. The not shown heating circuit is constituted by a voltage-reducing transformer making it possible to obtain on the secondary a very high alternating current for a low voltage, whereby said current directly traverses pane 64, whilst its frequency is relatively low, for example 20,000 Hz in order to reduce the volume of the air gap. As is more particularly illustrated in FIG. 4, the heating end of pane 64 is shaped in such a way that it has the maximum possible resistance. It is made from a non-tinnable, highly chemically resistant material which does not form oxides below 400° C., which has a good thermal conductivity and also a good heat capacity. Tungsten or molybdenum are preferably used.

According to the invention, the rotary frame 38 also carries a device for depositing on the wire to be welded resting on the conductive zone a given quantity of flux to be welded. This fluxing device is shown in FIG. 4. The device comprises a movable arm 66 and a sealed flux reservoir 68 having a constant level. Arm 66 has a curved end 70 which is normally immersed in a hole 72 formed on the base of reservoir 68 so as to be in permanent contact with flux 73. The level of the flux is maintained constant in hole 72 by means of a second hole 74 formed in the reservoir 68 slightly above hole 72. The dimensions of holes 72 and 74 are determined as a function of the diameter of end 70 of arm 66, the viscosity of flux 73, the thickness of the walls of reservoir 68 and the height of the liquid in the said reservoir. Thus, when a given quantity of flux is removed from the reservoir by hole 72 using arm 66, air enters by means of hole 74 on the vertical wall of the reservoir just above hole 72, so as to establish once again the pressure balance within reservoir 68.

As shown in FIG. 4, the displacements of arms 66 are controlled in a longitudinal direction by a first electromagnet 76 mounted so as to pivot about an axis 78, so that it can rock under the action of a second, not shown electromagnetic, articulated to electromagnet 76 by its stud hole 80. Obviously, the displacements of arms 66 can be controlled in some other way, the longitudinal movement of said arms being for example obtained by rotation.

Figure 5:
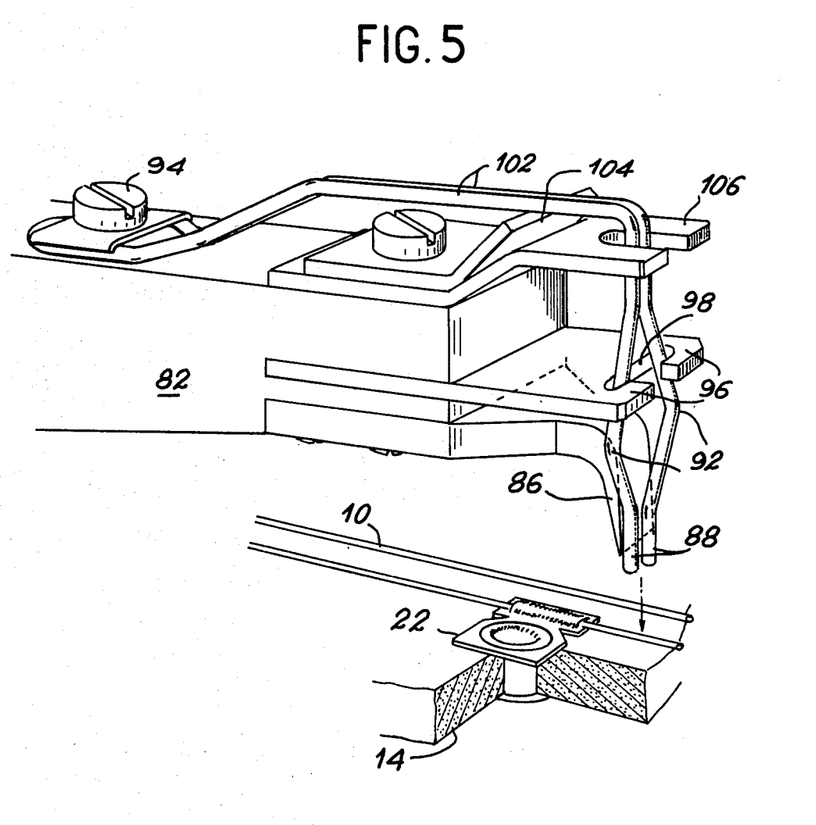
FIG. 5 a perspective view showing other tools carried by the apparatus of FIG. 3 and particularly a device which is able to cut the wire and grip the unwelded end thereof after it has been cut.

Finally, with reference to FIGS. 3 and 5, the rotary frame 38 carries by means of a pivot 84 the second arm 82, whose free end is provided with a knife 86 and a clamp 88. Arm 82 is controlled by an electromagnet 90. As illustrated in FIG. 5, which shows the free end of arm 82, knife 86 is constituted by a steel band, whose rectilinear cutting edge enables it to cut wires 10 after the latter have been welded to pellets 22.

The clamp 88 is made from a preshaped elastic wire, such as a piano cord, bent over in U-shaped manner to define the jaws 92 of the clamp by its two ends, the elastic wire being fixed to the median portion of arm 82 by a screw 94. The free end of arm 82 also rigidly carries two figures 90, which define between them a slot 98 which receives the jaws 92 of clamp 88. Fingers 96 cooperate with cam surfaces defined on the opposite edges of jaws 92. These cam surfaces are obtained through the ends of the wire defining clamp 88 being bent in a lozenge-shaped manner. Thus, the clamp is open when fingers 96 are in the vicinity of the acute angle of the lozenge defined by the opposite jaws at the end of clamp 88 and the latter then projects beyond the cutting blade of knife 86, as shown in FIG. 5. However, the clamp 86 is closed when its end is substantially aligned with the cutting edge of knife 86, because fingers 96 then cooperate with jaws 92 in the vicinity of the obtuse angles of the lozenge defined thereby and on the side of the end of the clamp. As will be shown hereinafter, when the clamp is closed, its opening can only be obtained by means of an abutment 100 defined on the welding iron 64 and able to engage with a corresponding abutment 102 defined on the upper part of clamp 88 with reference to FIG. 5. The abutment of abutments 100 and 102 makes it possible to move jaws 92 in a downward direction with respect to knife 86 in their open position towards which clamp 88 is displaced by the natural elasticity of the wire which forms it. The end of arm 82 also carries an abutment 105, against which bears the clamp 88 in the open position, together with a guide 106.

The apparatus for realising the interconnections of an electrical circuit on an insulating base support described hereinbefore with reference to FIGS. 3 to 5 functions in the following manner.

Figure 6A:
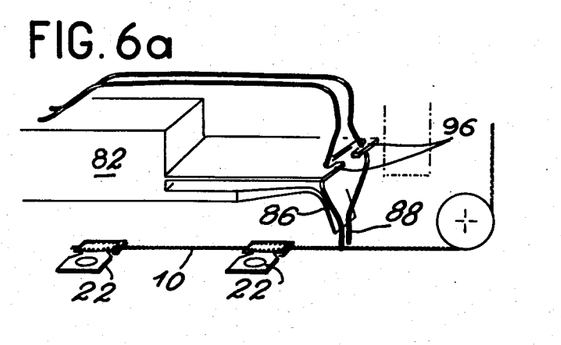
FIGS. 6a to 6h diagrammatically illustrate the different stages of using the apparatus of FIGS. 4 to 5.
Figure 6B:
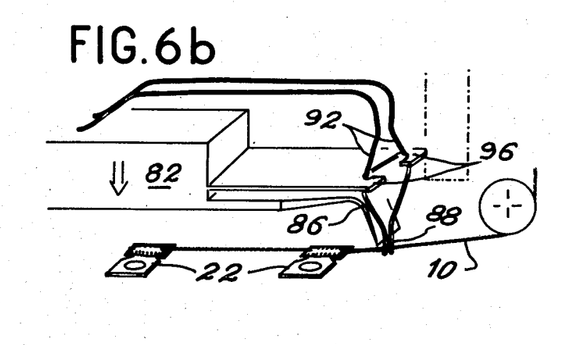
Figure 6C:
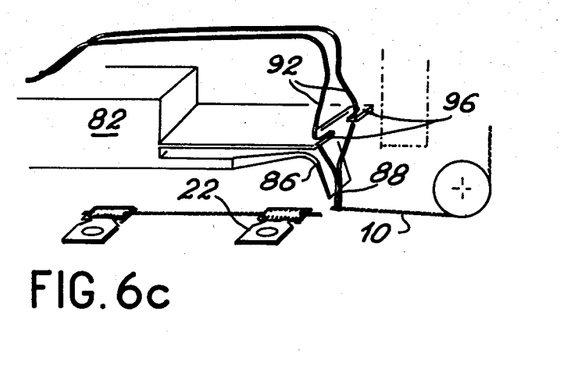

FIG. 6a illustrates the position occupied by arm 82 of apparatus 32 after providing an interconnection by means of wire 10 between two pellets 22. Runner 58 (see FIG. 4) is raised to the right of the pellet after which the wire is to be cut. Thus, the wire is not adhered in the cutting zone and its slope facilitates its gripping by clamp 88. Clamp 88 is then opened in the manner shown in FIG. 5 and its end projects beyond the cutting blade of knife 86. In order to cut wire 10, arm 82 rocks about the pivot 84 under the action of electromagnet 90 (see FIG. 2) and as shown in FIG. 6b, in such a way that the free end of the clamp 88 abuts with support 14. Arm 82 continues to rock until the cutting blade of knife 86 cuts wire 10 in such a way that its fingers 96, rigidly fixed to the knife 86, moves downwards relative to jaws 92 of clamp 88, as is successively illustrated in FIGS. 6b and 6c. The ends of jaws 92 are thus sufficiently close together to grip the unwelded end of wire 10, when the latter has been cut by knife 86. The clamp 88 is maintained in the closed position, despite the elasticity of the wire from which it is made, because the fingers 96 are then positioned slightly below the obtuse angles defined by the lozenge formed by jaws 92 and as illustrated in FIG. 6c.

Figure 6D:
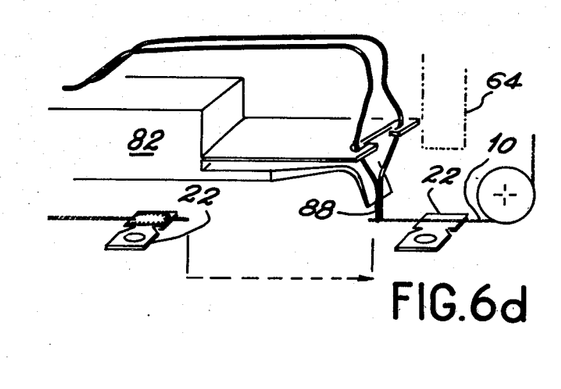

The connection provided by means of wire 10 is then completely terminated and the free end of the latter is secured by means of clamp 88, so that it can be brought onto another conductive pellet 22, as illustrated in FIG. 6d. The displacement of this tool-carrying head 32 (see FIG. 3) relative to the support in a plane parallel to the latter can be obtained either by displacement of table 60 (see FIG. 3), or by displacement of head 32, or by the combined displacement of both these members. Preferably, the translation movements are carried out by means of table 60 and the rotational movements by means of the pivoting head 32.

Figure 6E:
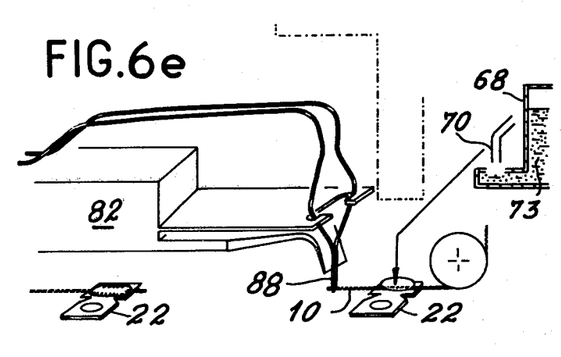

FIG. 6d illustrates the position in which the wire is placed just before the start of the making of a new interconnection between two pellets 22. The end of wire 10 is then disposed in the welding zone 28 of the corresponding pellet 22 and the plane 64 (see FIG. 4) of the welding iron is positioned vertically above said welding zone, wire 10 being maintained in this position by clamp 88. According to the invention, the fluxing device is then put into operation, i.e. arm 66 performs the path represented by mixed lines in FIG. 4 (also see FIG. 6e) between the hole 72 of reservoir 68 and wire 10, so as to pour onto that part of wire 10 positioned in the welding zone of pellet 22 a drop of flux 73 corresponding to a predetermined quantity sufficient for coating the wire and the corresponding face of the welding zone. When this operation is completed, arm 66 returns to the inoperative position in which its end 70 penetrates hole 72 in which the level has become identical to that which existed previously due to the penetration of an air bubble into the reservoir 68 sealed by hole 74.

Fluxing and welding can then be carried out by lowering the iron pane 64 until it comes into contact with wire 10, which is still held by clamp 88. Under the action of flux 73, previously deposited on wire 10 and welding zone 28, the heat produced by the energising of the welding iron is transferred almost instantaneously to the complete outer surface of wire 10 and to the welding zone of pellet 22 in such a way that the heating time making it possible both to sublimate the polyurethane varnish coating on the surface of wire 10 and to weld the wire bared in this way on the welding zone by melting the tin-lead layer on the surface thereof is significantly reduced compared with the prior art methods. This makes it possible to use smaller pellets 22, as shown in FIG. 2 without any danger of detachment or burning thereof. The miniaturisation of the interconnection circuit and the possibility of automatically making said circuit are therefore facilitated. Moreover, the use of the welding flux according to the invention makes it possible to reduce the oxidation phenomena of the tin-lead and of the copper wire, providing a contribution to reducing the heating time necessary for welding.

It should be noted that the result could not be obtained when using pellet 22 or zones 28, previously covered with flux. Thus, if the flux is deposited on the pellets beforehand, the solvent dries out and solid dry extracts are produced, so that the thermal contact between the iron, the wire and the pellet will be poor (contact on one generatrix of the wire). Even if it is assumed that the flux provided remains liquid on the pellets, it could not also cover the wire.

Figure 6F:
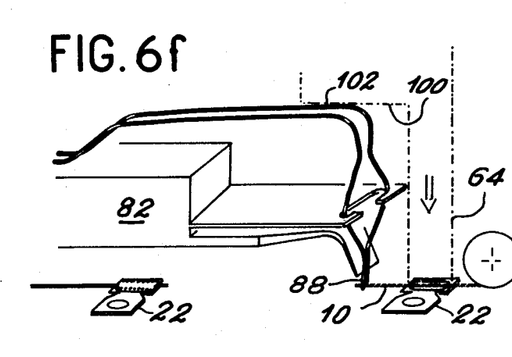
Figure 6G:
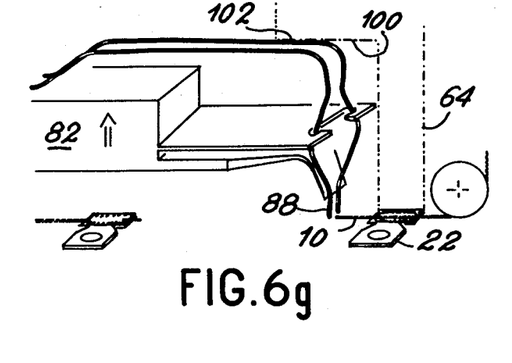
Figure 6H:
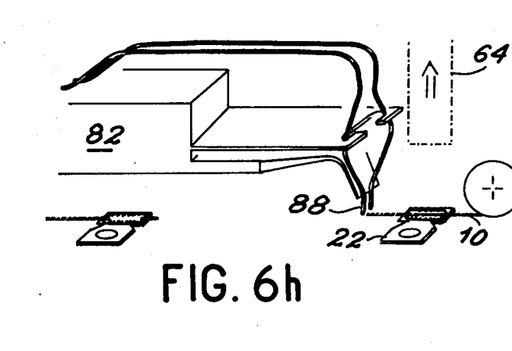

When making the electrical interconnection circuit on the support 14, the components such as box 16 are still not installed. The holes 20 necessary for the passage of clips 18 of said components are not therefore plugged, so that there is a risk of the tin flowing into the holes during the welding phase. This is increased by the small size of the pellets 22 according to the invention. However, this is prevented in the pellet shown in FIG. 2 by making a thermal shunt between the welding zone 28 and the connector 24 by means of triangular notches 30. This thermal shunt also makes it possible to maintain the wire on welding zone 28 when the weld has to be re-melted and particularly during "wave" welding. This is used when the circuit, which has been cabled and welded by the machine, is equipped with components (e.g. cases) for welding said components to the circuit. The clips of these components are then welded to the tin in the holes in the pellets in a collective manner by bringing a tin-lead "wave" into minimum contact with one surface of the card (the opposite surface to the components). Thus, the welds of the wires can be re-melted and the wires must therefore remain in position. The relatively short heating time is not determin by an extremely fast manipulation of the welding iron, but by an extremely short energizing thereof. Thus, when welding is at an end the iron 64 is kept in the low position shown in FIG. 6f in which the abutment 100 formed on the welding iron is level with the abutment 102 formed on clamp 88. The opening of the clamp 88 is then obtained by maintaining iron 64 in its low position, whilst moving arm 82 upwards as shown in FIG. 6g. The relative displacement between clamp 88 and the free end of arm 82 resulting from the engagement of abutment 102 with abutment 100 causes the opening of clamp 88, which then returns to the position of FIG. 5. The pane 64 of the welding iron is then raised as illustrated in FIG. 6h and another weld can be made in the manner described hereinbefore by bringing the tool-carrying head 32 into a facing position with respect to another pellet 22 in order to terminate the electrical interconnection, whose first weld has been described.

Obviously the embodiment of the invention described hereinbefore is not limitative and covers all variants.

In the performance of this invention and the basic patent the operations are preferably all performed automatically, the machine having a control programme produced by a computer.

We claim:

1. A method for producing an electrical interconnection circuit on an insulating base support incorporating conductive zones able to receive clips of electronic components, wherein said method comprises the steps of:
providing conductive zones comprising pellets, each defining a connector adapted to receive one of said clips, a wire welding zone, and a zone of reduced width area acting as a thermal shunt between said connector and said welding zone;
joining the different conductive zones to be interconnected by adhering a thermally weldable insulating wire to said base support;
depositing liquid flux on parts of the wire to be welded resting on said wire welding zones;
welding said parts of the wire to said wire welding zones;
cutting said wire after welding to form in said wire a welded end and an unwelded end;
gripping said unwelded end of the wire; and
bringing said unwelded end of the wire into contact with another wire welding zone.

2. A method according to claim 1, wherein said electronic components are provided with two groups of aligned clips, each pellet being substantially contained in a square whose side is substantially equal to three-fifths of a distance separating the center of two successive conductive zones of the same group, the welding zone occupying in the said square a rectangle whose surface is substantially equal to one-third of the total surface area of the square.

3. An apparatus for producing an electrical interconnection circuit on an insulating base support incorporating conductive zones each defining a connector adapted to receive one clip of an electronic component and a wire welding zone, said insulating base support being covered with adhesive resin outside said conductive zones, wherein said apparatus comprises an X-Y coordinate table to which is fixed the insulating base support, means for controlling the translations of said table in accordance with two perpendicular directions, a tool-carrying head constituted by a fixed shaft and a rotary frame connected to the shaft, means for controlling the rotation of the frame about an axis perpendicular to the support, means carried by the fixed shaft for uncoiling a thermally weldable insulated wire, means carried by the rotary frame for applying the wire to the support, means carried by the rotary frame for depositing a given quantity of liquid flux on parts of the wire to be welded resting on a conductive zone, means carried by the rotary frame for simultaneously baring and welding the thermally weldable wire to said welding zones, means carried by the rotary frame for cutting the wire after welding to form in said wire a welded end and an unwelded end, and means carried by the rotary frame for gripping the unwelded end of the wire to bring the latter into contact with another welding zone.

4. An apparatus according to claim 3, wherein the means for depositing a given quantity of liquid flux comprise a movable arm having a curved end and a constant level flux reservoir, the curved end of the arm being in permanent contact with the liquid flux when said arm is inoperative.

5. An apparatus according to claim 3 or 4, wherein said means for gripping the unwelded end of the wire incorporates a clamp and wherein said means for cutting the wire incorporates a knife, the clamp being carried by the knife and being provided with a curved end movable in a direction perpendicular to the base support in respect of the knife, whereby displacement of the curved end of the clamp relative to the knife controls opening and closing of the clamp.

6. An apparatus according to claim 5, wherein the curved end of the clamp projects beyond a cutting blade of said knife when the clamp is open, in such a way that the use of the knife leads first to the abutment of the curved end of the clamp with the base support, and then to displacement of the knife relative to said curved end of the clamp in a direction corresponding to closure of said clamp.

7. An apparatus according to claim 5, wherein said means for baring and welding the wire comprise an abutment which comes level with a facing abutment formed on the clamp during welding, in such a way that upon displacement of the knife away from the base support, the abutment of the clamp abuts against the abutment formed on the means for baring and welding the wire, whereby the knife moves relative to said curved end of the clamp in a direction corresponding to opening of the latter.

8. An apparatus according to claim 6, wherein the curved end of the clamp projects beyond a cutting blade of said knife when the clamp is open in such a way that the use of the knife leads first to the abutment of the curved end of the clamp with the base support, and then to displacement of the knife relative to said curved end of the clamp in a direction corresponding to closure of said clamp.

9. An apparatus according to claim 5, wherein said curved end of the clamp has two facing jaws drawn elastically away from one another and defining on their opposite edges cam surfaces with which cooperate fingers rigidly fixed to the knife, said cam surfaces having shapes such that the clamp is open when said curved end projects beyond the cutting blade of the knife and such that the clamp is closed when said curved end is substantially aligned with the cutting blade of the knife.

10. An apparatus according to claim 9, wherein the clamp is made from a preshaped elastic wire bent over in U-shaped manner to define the jaws of the clamp by two lozenge-shaped ends, said elastic wire being fixed to the knife by a median portion, said fingers fixed to the knife cooperating with the jaws in the vicinity of an acute angle of the lozenge opposite to the end of the clamp, when the latter projects beyond the cutting blade of the knife and cooperates with the jaws in the vicinity of the obtuse angles of the lozenge and on the side of the end of the clamp when the latter is substantially aligned with the cutting blade of the knife.

* * * * *